United States Patent
Barr et al.

(10) Patent No.: US 6,713,381 B2
(45) Date of Patent: Mar. 30, 2004

(54) METHOD OF FORMING SEMICONDUCTOR DEVICE INCLUDING INTERCONNECT BARRIER LAYERS

(75) Inventors: Alexander L. Barr, Austin, TX (US); Suresh Venkatesan, Austin, TX (US); David B. Clegg, Austin, TX (US); Rebecca G. Cole, Austin, TX (US); Olubunmi Adetutu, Austin, TX (US); Stuart E. Greer, Austin, TX (US); Brian G. Anthony, Austin, TX (US); Ramnath Venkatraman, Austin, TX (US); Gregor Braeckelmann, Austin, TX (US); Douglas M. Reber, Austin, TX (US); Stephen R. Crown, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/051,262

(22) Filed: Jan. 18, 2002

(65) Prior Publication Data

US 2002/0093098 A1 Jul. 18, 2002

Related U.S. Application Data

(62) Division of application No. 09/285,666, filed on Apr. 5, 1999, now abandoned.

(51) Int. Cl.[7] .......................................... H01L 21/4763
(52) U.S. Cl. ...................... 438/622; 438/613; 438/627; 438/638; 438/648; 438/687
(58) Field of Search ................................ 438/622, 618, 438/613–614, 627, 687, 685, 637–640, 643, 648

(56) References Cited

U.S. PATENT DOCUMENTS

| | | | |
|---|---|---|---|
| 5,220,199 A | 6/1993 | Owada et al. | |
| 5,470,787 A | * 11/1995 | Greer | 438/614 |
| 5,656,858 A | 8/1997 | Kondo et al. | |
| 5,686,760 A | 11/1997 | Miyakawa | |
| 5,731,624 A | 3/1998 | Motsiff et al. | |
| 5,767,010 A | * 6/1998 | Mis et al. | 438/614 |
| 5,904,556 A | 5/1999 | Suzuki et al. | |
| 6,187,680 B1 | 2/2001 | Costrini et al. | |
| 6,255,151 B1 | * 7/2001 | Fukuda et al. | 438/197 |

OTHER PUBLICATIONS

Colgan, "Selective CVD–W for Capping Damascene Cu Lines," Elsevier Science S.A., Thin Solid Films 262, pp. 120–123 (1995).

Marcadal, et al., "CVD Process for Copper Interconection," Elsevier Science B.V., Microelectronic Engineering 37/38, pp. 97–103 (1997).

Mori, et al., "Metal Capped Cu Interconnection Technology by Chemical Mechanical Polishing," VMIC Conference, ISMIC, Jun. 18–20, pp. 487–492 (1996).

* cited by examiner

Primary Examiner—Thanh Nguyen
(74) Attorney, Agent, or Firm—Robert A. Rodriguez; Michael J. Balconi-Lamica

(57) ABSTRACT

An interconnect overlies a semiconductor device substrate (10). In one embodiment, a conductive barrier layer overlies a portion of the interconnect, a passivation layer (92) overlies the conductive barrier layer and the passivation layer (92) has an opening that exposes portions of the conductive barrier layer (82). In an alternate embodiment a passivation layer (22) overlies the interconnect, the passivation layer (22) has an opening (24) that exposes the interconnect and a conductive barrier layer (32) overlies the interconnect within the opening (24).

13 Claims, 6 Drawing Sheets

METHOD OF FORMING SEMICONDUCTOR DEVICE INCLUDING INTERCONNECT BARRIER LAYERS

This application is a divisional of U.S patent application Ser. No. 09/285,666, filed on Apr. 5,1999, now abandoned.

FIELD OF THE INVENTION

This invention relates in general to processes for forming semiconductor devices, and more particularly to processes for forming semiconductor devices including interconnect barrier layers.

RELATED ART

Forming conductive bumps over semiconductor device bond pads is becoming increasingly common as the sizes and packages of the semiconductor devices continue to shrink. The bumps are used instead of wires to electrically connect the bond pads to their respective packaging leads. One specific type of bump includes a controlled-collapse chip-connection (C4) bump. Bumps generally require that a pad limiting metal layer be formed between the bond pad and the bump. Pad limiting metal layers typically include chrome and chromium alloys. However, these chromium-containing films can have defects, such as cracks and irregular grain boundaries, which limit the ability of the chromium layer to adequately separate the bond pad and the bump materials.

The bump typically includes elements such as tin (Sn) and lead (Pb). In the event the barrier fails to keep the bond pad and the bump separated, material from the bond pad can react with the lead or tin in the bump and intermetallic alloys of these materials can be formed. If the bond pad includes a copper-containing material, a brittle intermetallic alloy can be the result. The brittle intermetallic alloy can subsequently crack and result in bump failure. In addition, voids can form as a result of the alloying process and degrade adhesion between the bond pad and the bump. In extreme cases this can produce high resistance that can negatively impact the semiconductor device's performance and even result in failure of the semiconductor device.

BRIEF DESCRIPTION OF THE FIGURES

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

In accordance with embodiments of the present invention a semiconductor device and its method of formation are disclosed. In one embodiment, a conductive barrier layer overlies an interconnect, a passivation layer overlies the conductive barrier layer, and the passivation layer has an opening that exposes portions of the conductive barrier layer. In an alternate embodiment, a passivation layer overlies the interconnect, the passivation layer has an opening that exposes the interconnect, and a conductive barrier layer overlies the interconnect within the opening.

Figure 1:
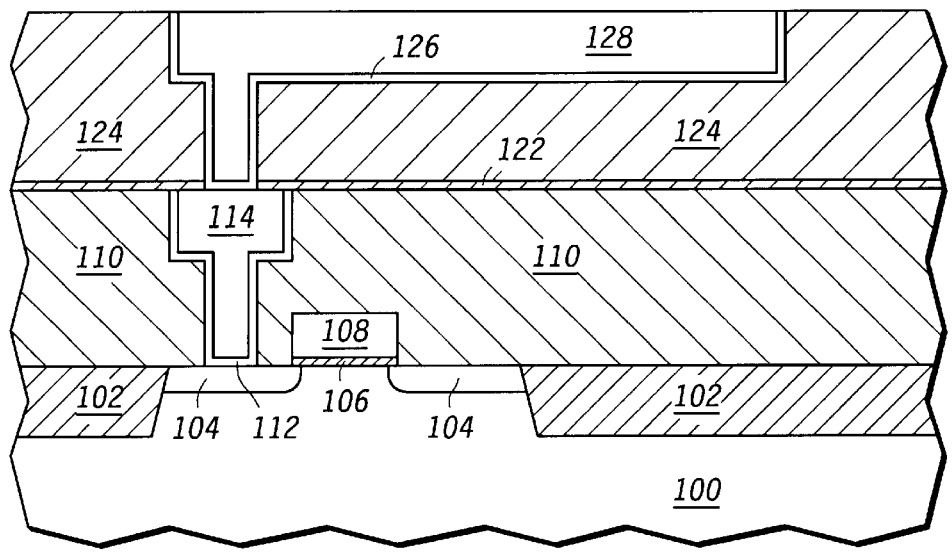
FIGS. 1–7 include illustrations of cross-sectional views of forming a semiconductor device having copper interconnects and bumps in accordance with a first set of embodiments.

FIG. 1 includes an illustration of a cross-sectional view of a portion of a semiconductor device. The semiconductor device includes a semiconductor device substrate 100, field isolation regions 102, and doped regions 104 formed within the semiconductor device substrate 100. A gate dielectric layer 106 overlies portions of the semiconductor device substrate 100 and a gate electrode 108 overlies the gate dielectric layer 106.

A first interlevel dielectric layer (ILD) 110 is formed over the gate electrode 108 and the semiconductor device substrate 100. The first interlevel dielectric layer 110 is patterned to form dual inlaid openings that are filled with a adhesion/barrier layer 112 and a copper fill material 114. The adhesion/barrier layer 112 is typically a refractory metal, a refractory metal nitride, or a combination of refractory metals or their nitrides. The copper fill material 114 is typically copper or a copper alloy, wherein the copper content is at least 90 atomic percent. The copper can be alloyed with magnesium, sulfur, carbon, or the like to improve adhesion, electromigration, or other properties of the interconnect. After depositing the adhesion/barrier layer 112 and the copper fill material 114, the substrate is polished to remove portions of the adhesion/barrier layer 112 and copper fill material 114 outside of the opening.

After forming the first interconnect level, an insulating barrier layer 122 is formed over the copper filled interconnect and first ILD layer 110. This insulating barrier layer 122 includes silicon nitride, silicon oxynitride or the like. Using an insulating material to form the insulating barrier layer 122 eliminates the need to form additional patterning and etch processes that would otherwise be required to electrically isolate the interconnects from one another if a conductive barrier would be used. A second ILD layer 124 is formed over the insulating barrier layer 122. A dual inlaid interconnect comprising a conductive adhesion/barrier layer 126 and a copper fill material 128 is formed within the second ILD 124. The dual inlaid interconnect is formed using processes and materials similar to those used to form the dual inlaid interconnect structure in the first ILD layer 110.

Figure 2:
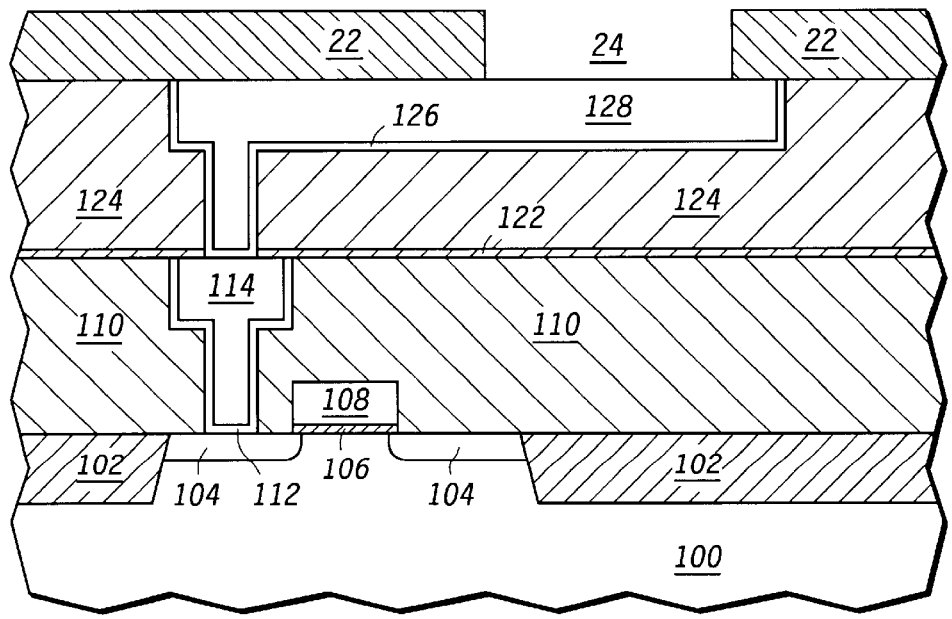

A passivation layer 22 is then formed over the second ILD layer 124 and the dual inlaid interconnect, as shown in FIG. 2. The passivation layer can include one or more films of silicon nitride, silicon oxynitride, silicon dioxide, or the like. Portions of the passivation layer 22 closest to the copper fill material 128 typically include silicon nitride or a silicon oxynitride film having a higher concentration of atomic nitrogen relative to atomic oxygen. The passivation layer 22 is patterned to form a bond pad opening 24 that extends through the passivation layer to the copper fill material 128.

Figure 3:
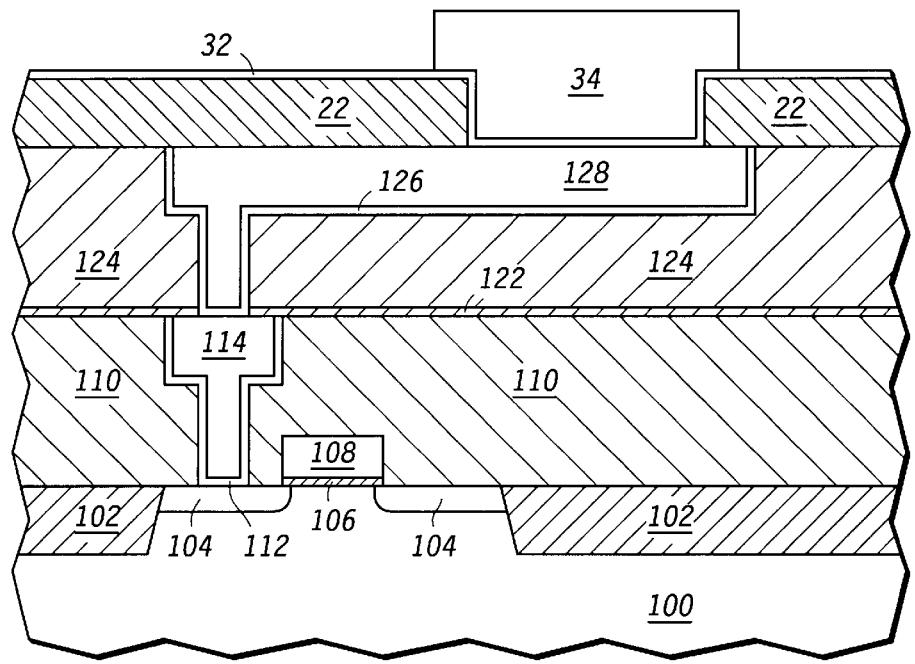

A conductive barrier layer 32 is deposited over the passivation layer 22 and the copper fill material 128, as shown in FIG. 3. The conductive barrier layer 32 can be deposited using processes that can include chemical vapor deposition, physical vapor deposition, evaporation deposition, electroplating, electroless plating, or the like. The thickness of this layer is generally in a range of approximately 50 to 300 nanometers (nm). Typically, the conductive barrier layer 32 includes a refractory metal, a refractory metal nitride, or a combination thereof. In one embodiment the conductive barrier layer 32 includes a combination of titanium (Ti) and titanium nitride (TiN). The titanium/titanium nitride stack improves adhesion to the underlying copper fill material 128 and passivation layer 22. Additionally, the titanium nitride forms a barrier that prevents the copper fill material from reacting with subsequently deposited conductive bumps. Alternatively, the conductive barrier layer 32 can include other materials such as tantalum (Ta), tantalum nitride (TaN), tungsten (W), titanium tungsten nitride (TiWN), titanium tungsten (TiW), tungsten nitride (WN), molybdenum nitride (MoN), cobalt nitride (CoN), or a combination of thereof. In other embodiments, oxygen tolerant materials can be used. These materials can include platinum (Pt), palladium (Pd), nickel (Ni), conductive metal oxides or their corresponding metals, or the like. The conductive metal oxides and their corresponding metals can further include iridium (Ir) and iridium oxide ($IrO_2$); ruthenium (Ru) and ruthenium oxide ($RuO_2$); rhenium (Re) and rhenium oxide ($ReO_2$ and $ReO_3$) or osmium (Os) and osmium oxide ($OsO_2$)

A resist layer 34 is then formed over the conductive barrier layer 32. The resist layer 34 exposes portions of the conductive barrier layer 32 overlying the passivation layer 22. The resist is formed such that it covers the bond pad opening 34. In addition, it can also be patterned to extend slightly over surface portions of the conductive barrier layer 32 lying above passivation layer 22, as shown in FIG. 3.

The conductive barrier layer 32 is then etched, using conventional etching processes, to remove the exposed portions of the conductive barrier layer 32 overlying passivation layer 22. After the etch, the patterned resist layer 34 is removed using a plasma ashing process or, alternatively, using a wet chemical process that uses organic chemicals, such as N-methyl-2-pyrrolidone, acetone, methyl isobutyl ketone (MIBK) or the like.

Figure 4:
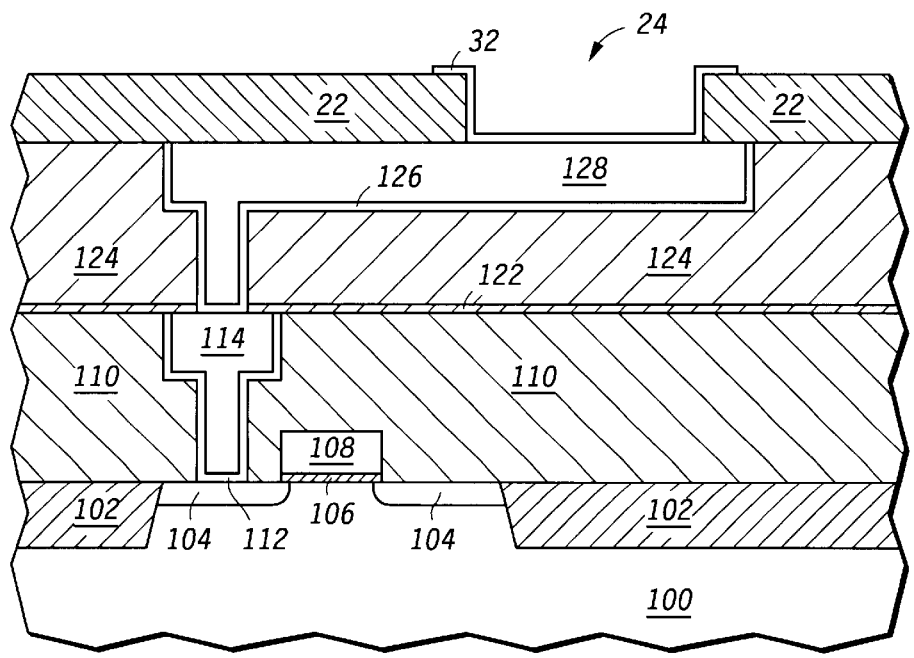

Alternatively, if a plating process such as electroplating or electroless plating is used to form the conductive barrier layer, the previously described patterning process may not be necessary. Instead, the conductive barrier layer can be plated directly over the exposed portions of the copper fill material 128 after forming opening 24. If so desired, plating can proceed to the extent where the plated material overlies a portion of the passivation layer to form the conductive barrier layer 32, as shown in FIG. 4.

Figure 5:
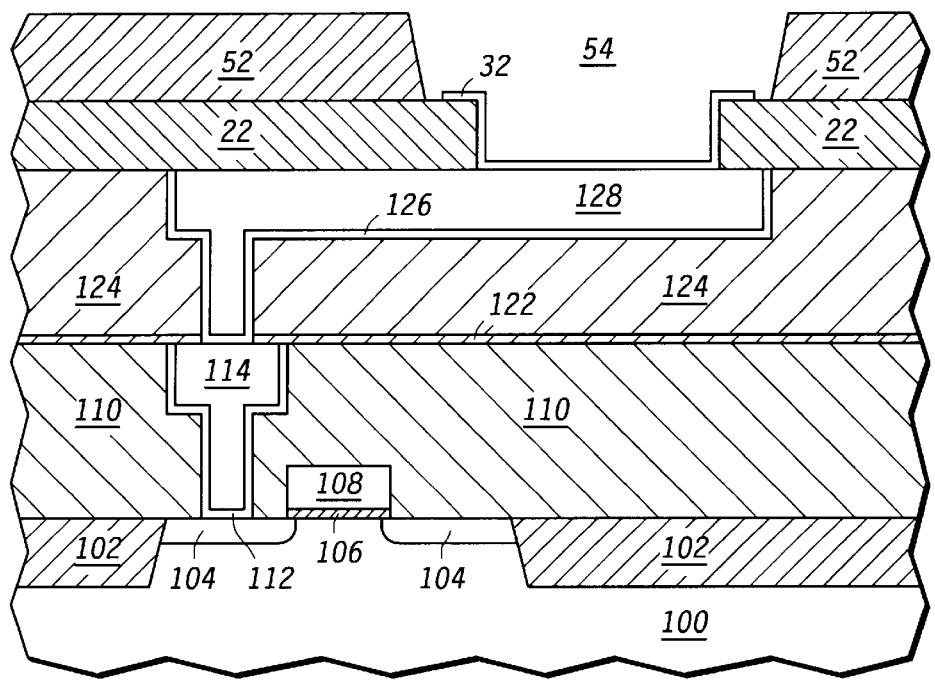

A die coat layer 52 is then formed over the semiconductor device and patterned to form a die coat opening 54 overlying the bond pad opening 24, as shown in FIG. 5. In this specific embodiment, the peripheral portion of the conductive barrier layer 32 have edges that are exposed within the die coat opening 54. The die coat layer 52 can be formed as a photo-imagable polyimide film or, alternatively, as a polyimide film that is patterned using conventional resist and etch processing.

Figure 6:
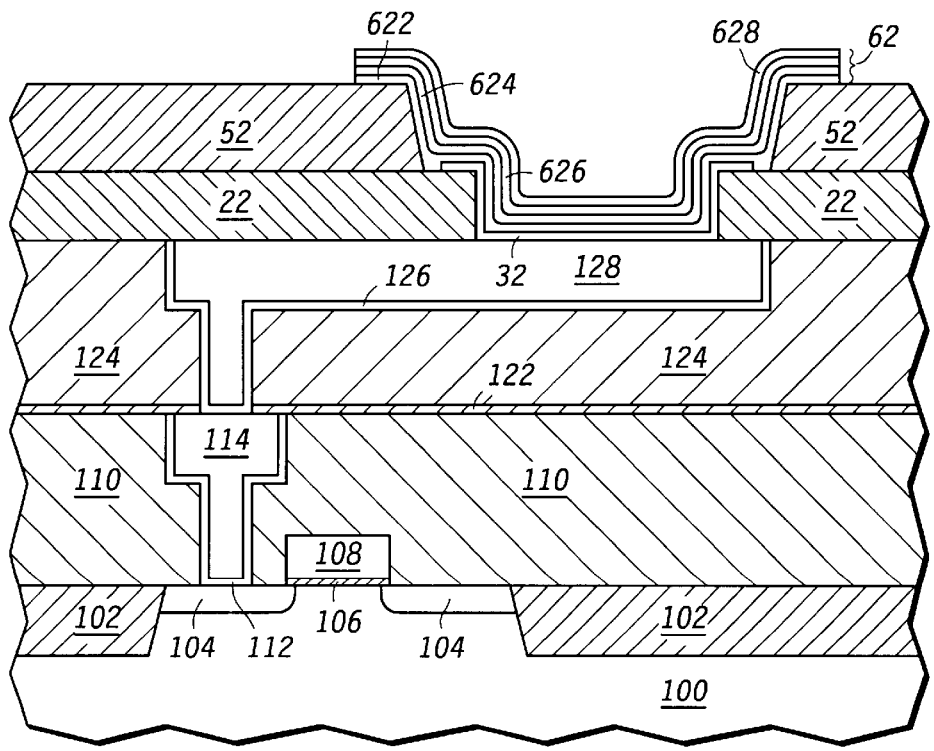

Prior to forming a pad limiting metal layer 62, as shown in FIG. 6, exposed portions of the conductive barrier layer 32 are processed through a radio frequency (RF) sputter clean. The RF sputter clean improves contact resistance between the barrier layer and the pad limiting metal layer 62 by removing uppermost portions of the conductive barrier layer 32 that can contain impurities, such as oxygen, carbon, fluorine, and chlorine. In one embodiment, the RF sputter clean process is performed as part of an in-situ process prior to depositing the pad limiting metal (underbump) layer. In one embodiment, the processing parameters for performing the RF sputter clean are as follows: RF power is in a range of approximately 1200 to 1500 Watts (W), direct current (DC) bias voltage is in a range of approximately −300 to −600 volts (V), pressure is in a range of approximately 0.1 to 0.5 Pascals, and time is in a range of approximately 150 to 250 seconds. The RF sputter clean process removes approximately 20–40 nm of barrier material from the surface of the barrier layer 32.

The pad limiting metal layer 62 is then formed within the die coat opening 54 as illustrated in FIG. 6. A Pad limiting metal layer typically includes a functional combination of films that can include an adhesion film, an intermediate coupling/solderable film and an antioxidation barrier film. In one embodiment, the pad limiting metal layer 62 includes a composite of four different films: a chromium film 622, a chromium-copper alloy film 624, a copper film 626, and a gold film 628. The chromium film 622 and the chromium-copper alloy film 624 each have a thickness in a range of approximately 50 to 500 nm, the copper film 626 has a thickness in a range of approximately 700 to 1300 nm, and the gold film 628 has a thickness in a range of 80 to 140 nm. Alternatively, the pad limiting metal can include other combinations of films such as a composite of titanium, copper and gold or a composite of titanium, nickel, copper and gold. The pad limiting metal layer 62 is typically formed by evaporation using a shadow mask. However, other methods, such as sputtering can alternatively be used to form the pad limiting metal.

Figure 7:
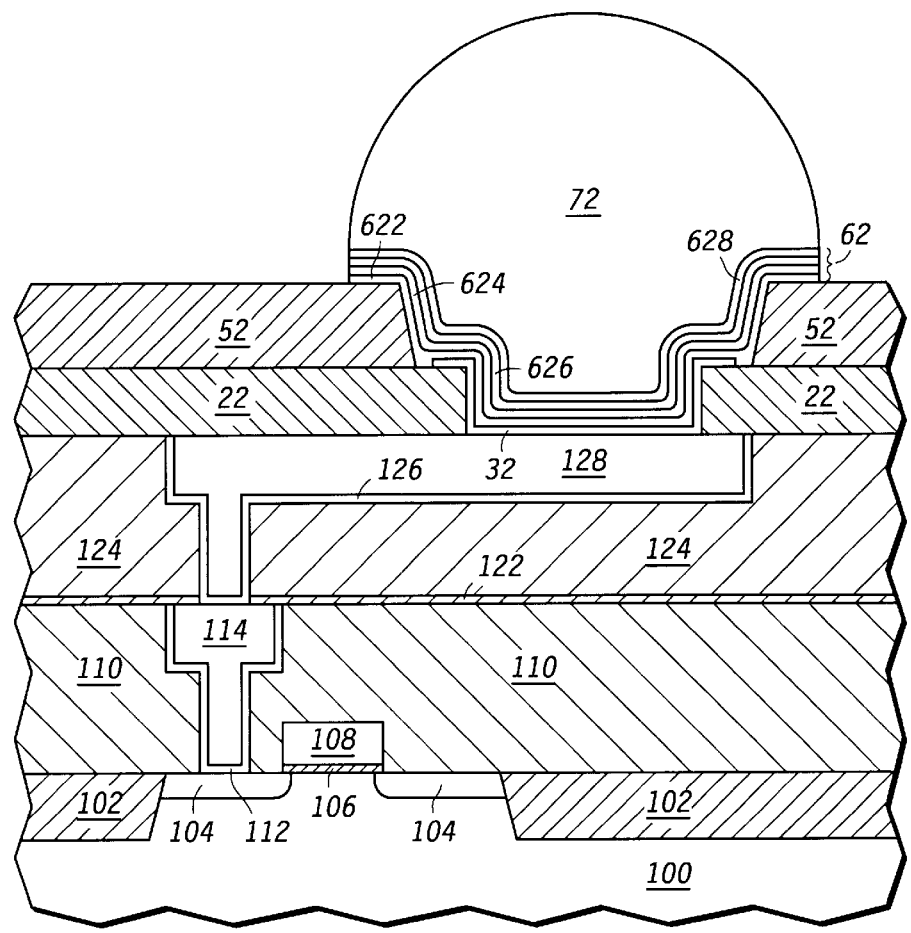

In accordance with one embodiment, following the formation of pad limiting metal layer, a bump material, such as a lead tin solder material 72 is deposited over the pad limiting metal layer 62 as shown in FIG. 7. The lead tin solder material 72 can be evaporated using a shadow mask or, alternatively, it can be formed using other conventional methods, such as plating or solderjetting. A reflow processing step is then performed to round the corners of the lead tin solder material 72 and form the bump as shown in FIG. 7.

At this point in the process, a substantially completed semiconductor device has been made. This device can subsequently be attached to a packaging substrate such as a flip chip or ball grid array package. Although not shown, other levels of interconnects can be formed as needed. Similarly, other interconnects can also be made to the gate electrode 108 and the doped region 104. If additional interconnects would be formed, they would be formed using processes similar to those used to form and deposit insulator barrier layer 122, second ILD layer 124, adhesion/barrier layer 126, and copper fill material 128.

Figure 8:
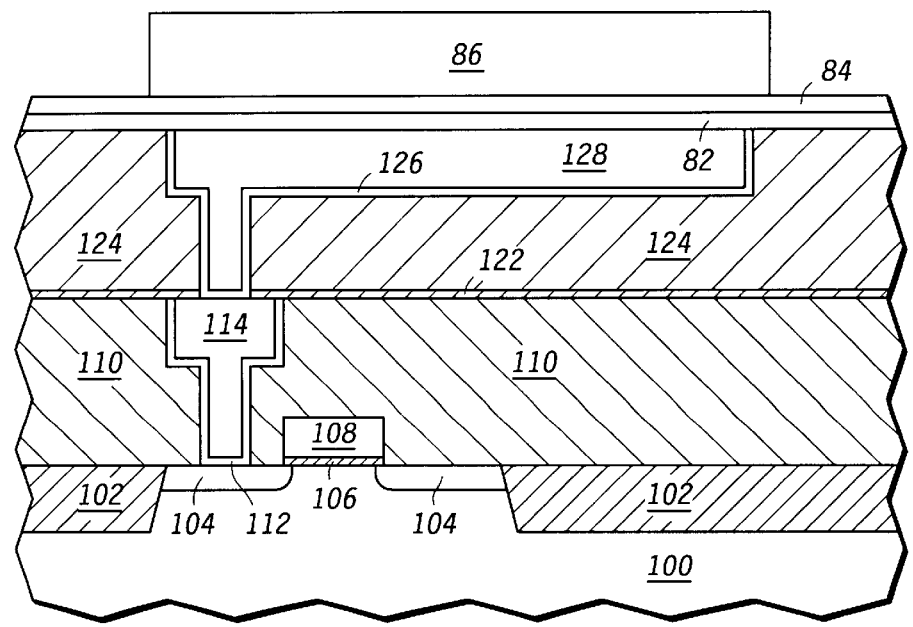
FIGS. 8–12 include illustrations of cross-sectional views of forming a semiconductor device having copper interconnects and bumps in accordance with a second set of embodiments.

FIGS. 8–12 illustrate an alternative embodiment of the present invention. Referring to FIG. 8, a conductive barrier layer 82 is formed over the second ILD layer 124 and copper fill material 128. The conductive barrier layer 82 is formed by any of the methods or materials described in forming the conductive barrier layer 32 as first shown in FIG. 3. The thickness of the conductive barrier layer 82 is typically in a range of approximately 50 to 300 nm. In this particular embodiment, an optional oxidation-resistant layer 84 is then formed over the conductive barrier layer 82. The oxidation-resistant layer can include any material that either prevents oxidation of the underlying layer or is more readily oxidized in preference to the underlying layer. Examples of materials that can be used include silicon nitride, polysilicon, amorphous silicon, or a conductive metal oxide or its corresponding conductive metal. The oxidation-resistant layer 84 has a thickness in a range of approximately 10–50 nm. A resist layer 86 is then formed over the conductive barrier layer 82 and the oxidation-resistant layer 84. The resist layer 86 is patterned to cover portions of the conductive barrier layer 82 and the oxidation-resistant layer 84 overlying the copper fill material 128 and the adhesion/barrier layer 126.

Figure 9:
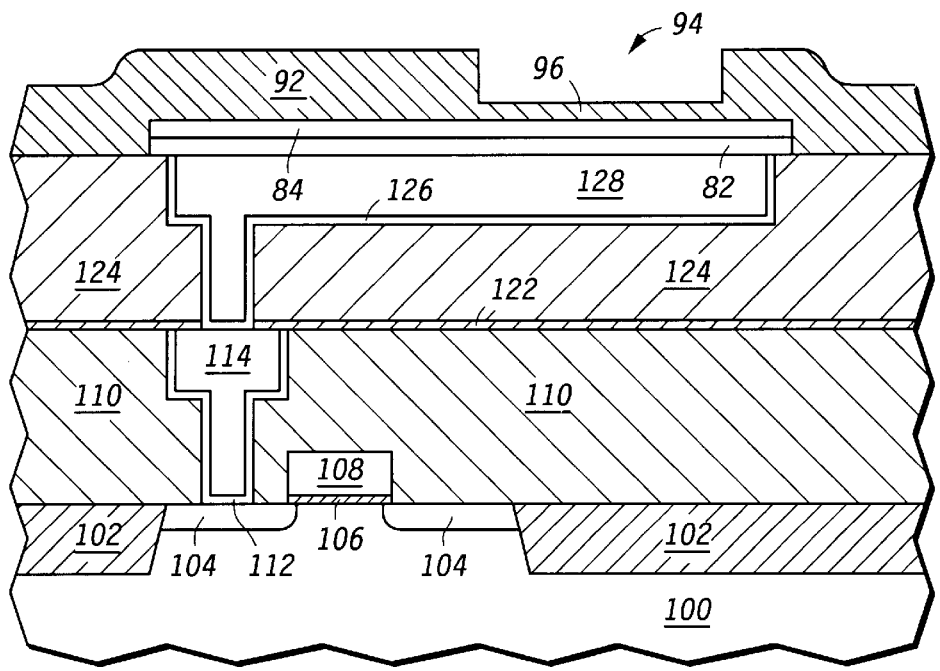

The unpatterned portions of conductive barrier layer 82 and oxidation-resistant layer 84 are then removed using conventional etching processes. The resist is then removed, and a passivation layer 92 is formed over the stack comprising conductive barrier layer 82 and oxidation-resistant layer 84, and portions of the dielectric layer 124 as shown in FIG. 9. The passivation layer 92 is similar to the passivation layer 22, first introduced in FIG. 2. In this particular embodiment, the passivation layer 92 is patterned to form a bond pad opening 94. As illustrated in FIG. 9, not all of the passivation layer within the bond pad opening is removed. Therefore, the bond pad opening is only partially formed during the patterning process. A residual portion 96 is left to remain over the oxidation-resistant layer 84 after patterning in complete.

Figure 10:
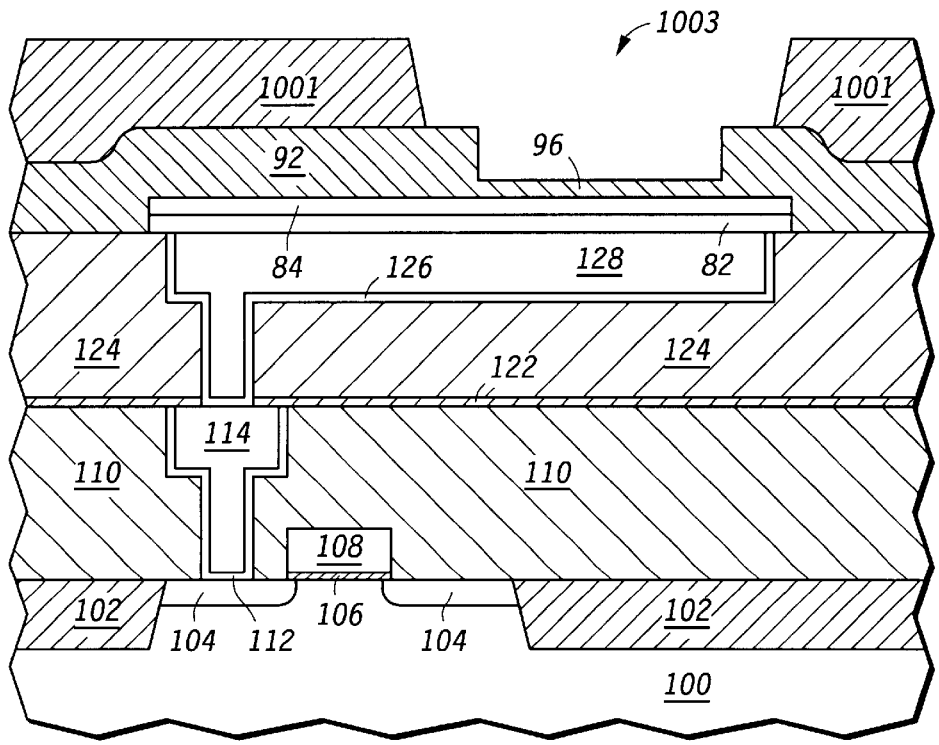
Figure 11:
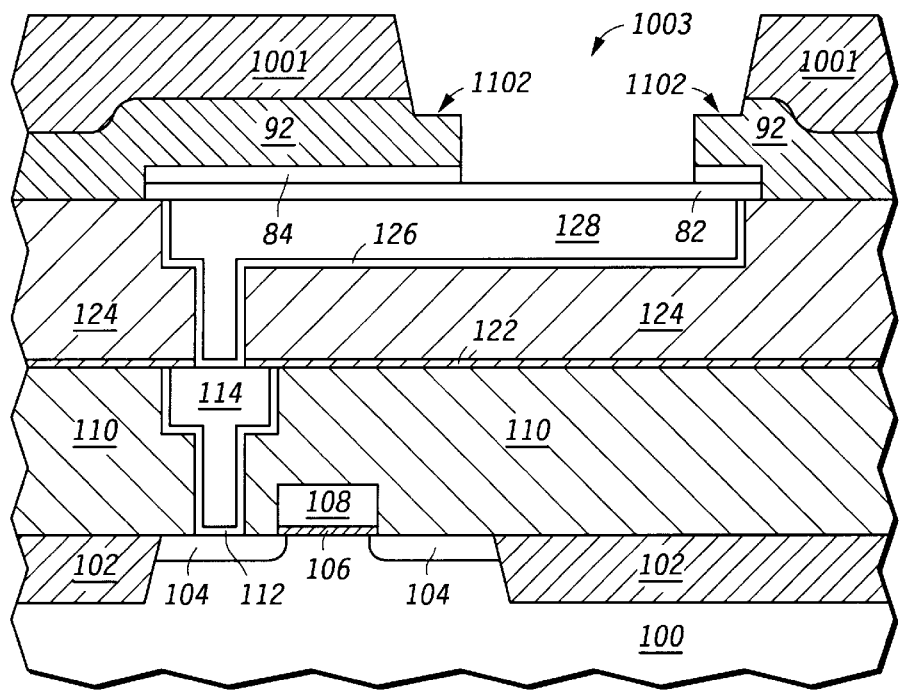

A die coat layer 1001 is then formed and patterned to form a die coat opening 1003, as shown in FIG. 10. The die coat layer 1001 is similar to the die coat 52, as first introduced in FIG. 5. The die coat opening 1003 exposes portions of the passivation layer 92, including the residual portion 96. After forming the die coat opening 1003, an etch is performed to remove the residual portion 96 and the underlying oxidation-resistant layer 84. This forms the die coat opening 1103, as shown in FIG. 11. During this etch, portions of the passivation layer 92 exposed by the die coat layer 1001 are also etched, as indicated by the removed passivation layer portions 1102. In one particular embodiment, the passivation layer 92 includes silicon and nitrogen, such as silicon nitride or silicon oxynitride, and the oxidation-resistant layer 84 includes silicon nitride. Therefore, the same or similar etch chemistries can be used to remove the residual portions 96 of the passivation layer 92 and the oxidation-resistant layer 84.

Figure 12:
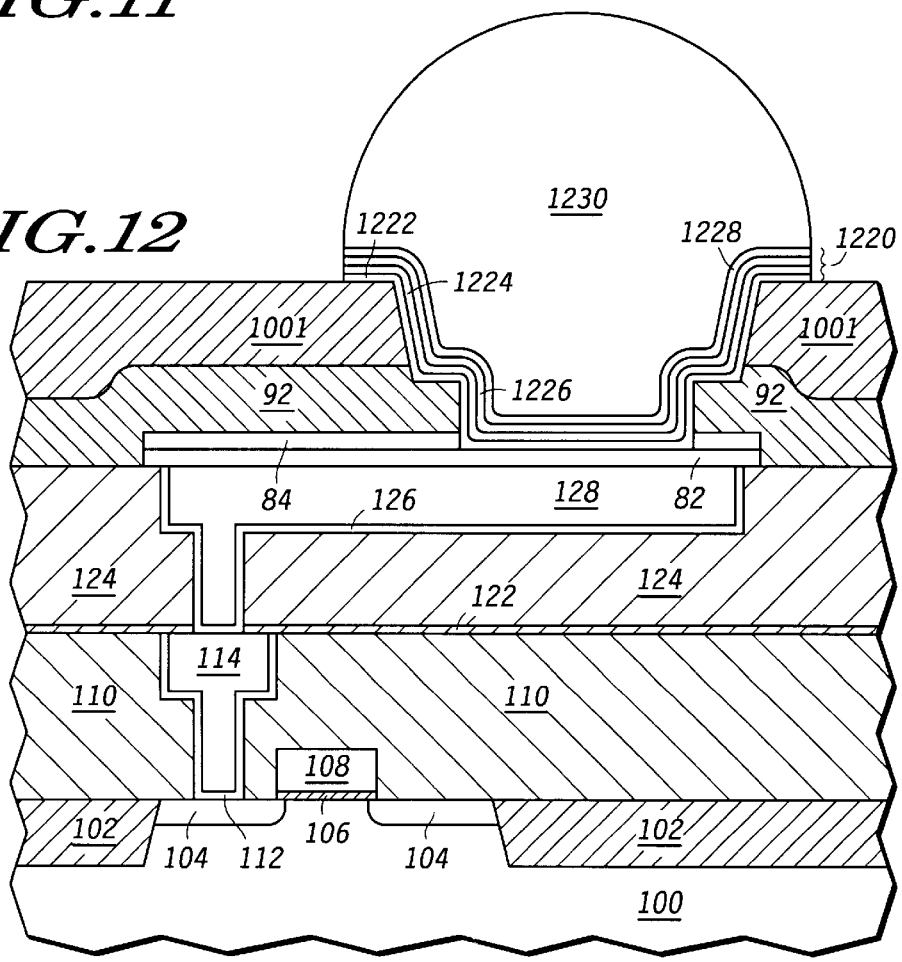

Processing is continued to form a substantially completed device as shown in FIG. 12. A pad limiting metal layer 1220 is formed similar to the one previously described and includes the chromium film 1222, the chromium-copper alloy film 1224, copper film 1226, and gold film 1228, and the lead tin solder 1230. If necessary, an RF sputter cleaning process, similar to that described previously, can be used to prepare the surface of the barrier layer prior to forming the pad limiting metal layer 1220. In this particular embodiment, a reflow step is performed to round the shape of the lead tin solder, giving it a dome-like appearance, as shown in FIG. 12.

In the embodiments described in FIGS. 9–12, the insulating barrier layer 122 is used for all interconnect levels except for the uppermost interconnect level. The uppermost interconnect level is the interconnect level over which the bond pans are formed. Therefore, it is the only interconnect level that uses the conductive barrier layer 82.

There are many other embodiments that are possible with the present invention. Turning to FIG. 3, the conductive barrier layer 32 can also include an overlying oxidation-resistant layer similar to the oxidation-resistant layer 84 described in the second set of embodiments in FIGS. 8–12. Similarly, the second set of embodiments do not necessarily require the use of the oxidation-resistant layer 84 because the residual portion 96 of the passivation layer 92 allows an oxygen-containing plasma to be used without damaging the conductive barrier layer 82. This can be important when the conductive barrier layers 82 or 32 include tantalum nitride, titanium nitride, or the like, which can adversely react with oxygen-containing plasmas or other chemicals used to remove or develop resist or polyimide. Examples of these chemicals can include tetramethyl ammonium hydroxide, N-methyl-2-pyrrolidone, acetone, MIBK, and the like.

In addition to forming the conductive barrier layer over the bond pad as described in FIGS. 9–12, the conductive barrier material can also be used to form focused energy-alterable, or laser-alterable, connections between conductive regions of the semiconductor device. The conductivity of these connections can be modified, using the laser, to program or adjust the circuitry of the device.

Forming the laser-alterable connections using the conductive barrier layer has advantages over the prior art. The conductive barrier layer is typically much thinner, less thermally conductive, and less reflective than the interconnect layer, which is normally used to form the laser-alterable connection. The conductive barrier layer is also self-passivating as compared to the interconnect layer. Therefore, reliability of the laser alteration is generally improved because the potential for shorting after laser alteration is reduced. In addition the laser-alterable connection is formed closer to uppermost surface of the semiconductor device. This allows the laser to use less power to affect the conductivity of the laser-alterable connection, which correspondingly reduces the potential of causing shorts, damaging adjacent connections, and damaging the surrounding passivation layer. Furthermore, the conductive barrier layer and the laser-alterable connections can be formed simultaneously using the same layer. Therefore, the process integration requires no additional processing steps.

Although specific materials were listed with respect to the pad limiting metal layer 62, other materials and other variations of this integration scheme can alternatively be used. For example, the conductive barrier layer can be incorporated as part of the pad limiting metal layer. In this case, it can be evaporated or sputtered onto the wafer before forming the other respective pad limiting metal layer films. In yet another embodiment, the pad limiting metal layer and the solder material can collectively be formed by physical vapor deposition or by jet printing, whereby individual molten solder drops are deposited into place by an orifice.

The embodiments described herein can be integrated into an existing process flow without a need to use exotic materials, develop new processes, or purchase new processing equipment. The conductive barrier layers 32 and 82 are sufficient to prevent the copper from the interconnect and the lead tin solder from the bump from reacting with each other. Therefore, integrity is maintained at the interface between the bump and the interconnect. This improves the mechanical integrity of the bump as well as helps to reduce the electrical resistance between the bump and the interconnect.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method of forming a semiconductor device comprising:
   forming a first interconnect overlying a semiconductor device substrate;
   forming a second interconnect overlying portions of the first interconnect, wherein the second interconnect is further characterized as a copper interconnect having a bond pad portion;
   forming a conductive barrier layer over the bond pad portion;
   forming an oxidation-resistant layer over the conductive barrier layer;
   forming a passivation layer overlying the oxidation-resistant layer; and
   forming a partial opening in the passivation layer, wherein a depth of the partial opening is less than a thickness of the passivation layer in a region of the passivation layer where the partial opening is formed;
   forming a die coat layer over the passivation layer;
   forming an opening in the die coat layer, wherein forming the opening in the die coat layer exposes the partial opening in the passivation layer and further includes partially removing the passivation layer about an edge region of the partial opening in the passivation layer;
   etching through the partial opening in the passivation layer to expose the conductive barrier layer after forming the opening in the die coat layer; and
   forming a pad limiting metal over the conductive barrier layer, wherein the pad limiting metal layer includes a chromium layer and wherein the chromium layer contacts the conductive barrier layer; and
   forming a conductive bump over the pad limiting metal layer.

2. The method of claim 1, wherein a portion of the conductive barrier layers forms a laser-alterable connection between at least two conductive regions.

3. The method of claim 1, wherein the conductive barrier layer includes one selected from a group consisting of titanium and titanium nitride.

4. The method of claim 1 wherein the oxidation-resistant layer includes silicon nitride.

5. The method of claim 1, wherein the conductive barrier layer includes a refractory metal nitride.

6. The method of claim 1, wherein the conductive barrier layer includes a material selected from a group consisting of titanium, tantalum, tungsten, iridium, and nickel.

7. The method of claim 1, wherein the conductive barrier layer includes a combination of a refractory metal and a refractory metal nitride.

8. The method of claim 7, wherein the conductive barrier layer includes titanium and titanium nitride.

9. The method of claim 1, wherein the conductive barrier layer includes at least one of tantalum nitride, titanium tungsten nitride, titanium tungsten, tungsten nitride, molybdenum nitride, and cobalt nitride.

10. The method of claim 1, wherein the conductive barrier layer includes at least one of platinum, palladium, and nickel.

11. The method of claim 1, wherein the conductive barrier layer includes at least one of iridium, iridium oxide, ruthenium, ruthenium oxide, rhenium, rhenium oxide, osmium and osmium oxide.

12. The method of claim 1, wherein the oxidation-resistant layer includes nitrogen.

13. The method of claim 1, wherein the oxidation-resistant layer is a silicon layer.

* * * * *